(12) United States Patent  (10) Patent No.: US 8,063,665 B1
Rohilla et al.  (45) Date of Patent: Nov. 22, 2011

(54) PROGRAMMABLE BUFFER CIRCUIT

(75) Inventors: Gajender Rohilla, Bothell, WA (US);
Eashwar Thiagarajan, Bothell, WA (US); Harold Kutz, Edmonds, WA (US);
Monte Mar, Issaquah, WA (US);
Mohandas Palatholmana Sivadasan, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/496,612

(22) Filed: Jul. 1, 2009

Related U.S. Application Data

(60) Provisional application No. 61/077,464, filed on Jul. 1, 2008.

(51) Int. Cl.
*H03K 19/0175* (2006.01)
(52) U.S. Cl. ............... 326/86; 326/26; 326/68
(58) Field of Classification Search ............ 326/21, 326/26, 30, 68, 86; 327/551–553, 557–559
See application file for complete search history.

(56) References Cited

U.S. PATENT DOCUMENTS

| 7,489,745 | B2 * | 2/2009 | Fudge | 375/340 |
| 7,555,263 | B1 * | 6/2009 | Rofougaran et al. | 455/20 |
| 7,583,179 | B2 * | 9/2009 | Wu et al. | 340/10.1 |

* cited by examiner

*Primary Examiner* — James H Cho

(57) ABSTRACT

A buffer circuit includes an input configured to receive an input signal; and a buffer configured to generate an output signal based on the input signal. In an embodiment, the output signal has a linear relationship with the input signal when the input signal is within the input voltage range; and the buffer circuit further includes a level-shifting circuit coupled with the input, wherein the level shifting circuit determines an input voltage range, and wherein one of an upper limit and a lower limit of the input voltage range is within 50 millivolts from a supply rail voltage. In another embodiment, the buffer circuit further includes a programmable chopping module coupled with the buffer, wherein the programmable chopping module is programmable with a selected configuration from a plurality of configurations, and wherein the programmable chopping modulates the input signal based on the selected configuration. In yet another embodiment, the buffer circuit further includes a programmable output filter coupled with the buffer, wherein the programmable output filter is programmable with a selected configuration from a plurality of configurations, and wherein the programmable output filter filters a frequency band of the output signal based on the selected configuration.

19 Claims, 5 Drawing Sheets

PROGRAMMABLE BUFFER CIRCUIT

RELATED APPLICATIONS

This application claims the benefit of U.S. Provisional Application No. 61/077,464, filed on Jul. 1, 2008.

TECHNICAL FIELD

This disclosure relates to the field of analog-to-digital conversion, and particularly to buffering in an analog-to-digital converter.

BACKGROUND

Analog-to-digital converters (ADCs) are commonly used to convert analog signals, such as voltage or current signals, into digital codes that can be processed by a computer system. For example, an ADC may receive a voltage signal that varies over time and convert the voltage signal into a stream of digitally encoded values in binary format. The ADC may divide the dynamic range of the received voltage signal into a number of levels, where each level is represented by a different binary code.

ADCs can be used in sensor applications, where an electrical signal generated by a sensor (such as a transducer) is converted to a digital code. For instance, the sensor output may provide an analog voltage or current to an input of an ADC. In some cases, the accuracy of the sensor may be degraded if the ADC to which it is connected draws too much current. An ADC with a low input impedance, for example, may draw too much current from the sensor output, dropping the sensor's output voltage.

BRIEF DESCRIPTION OF THE DRAWINGS

The present disclosure is illustrated by way of example, and not by way of limitation, in the figures of the accompanying drawings.

DETAILED DESCRIPTION

Described herein is an apparatus and method for buffering an input to an analog-to-digital converter (ADC). In one embodiment, a buffer circuit includes a number of programmable circuit modules, where each of the programmable circuit modules can be configured to affect the output of the buffer circuit, relative to an input signal to the buffer circuit. For example, the buffer circuit may include modules implementing programmable gain, level shifting, chopping, filtering, or other functions. In one embodiment, the buffer can be bypassed and powered down when not in use, or may be programmed to operate in either differential mode or single-ended mode.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format. Thus, the specific details set forth are merely examples. Particular implementations may vary from these exemplary details and still be contemplated to be within the spirit and scope of the present invention.

One type of ADC utilizes switched capacitors. In such an ADC, a switched capacitor input stage can consume current to charge a capacitor during the course of a measurement cycle. The equivalent input resistance for such an input stage would be on the order of 1/fs×C, where fs is the switching frequency and C is the capacitance. For a switching frequency fs of 3 MHz and an input capacitance of 5 pF, the input resistance would be approximately 66 kΩ. Since many sensor applications require a much higher input impedance to achieve accurate readings, an input buffer may be used as an analog front end to the switched capacitor ADC. The input buffer provides a high-impedance input for the sensor.

Figure 1:
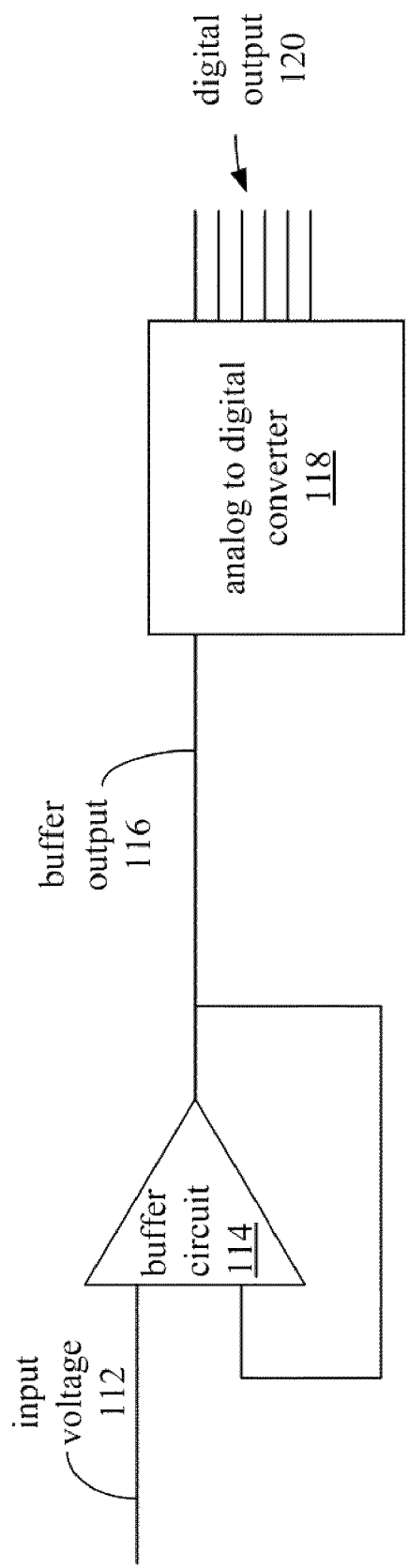
FIG. 1 is a circuit diagram illustrating one embodiment of buffer circuit.

FIG. 1 shows an analog to digital converter (ADC) 18 that generates a digital code at digital output 120, based on an input signal. A small impedance at the input of the ADC 118 can draw current and affect the measurement of a voltage applied directly to the input of ADC 118. For instance, if a sensor is connected directly to the ADC 118, the ADC may, over the course of a measurement, draw enough current from the sensor output to decrease the sensor output voltage. Accordingly, a buffer circuit 114 can be attached to the input of the ADC 118 to increase the input impedance and prevent the ADC 118 from adversely affecting the input voltage 112.

In one embodiment, buffer 114 may be unable to operate over a full rail-to-rail analog voltage range that is being buffered prior to being input into the ADC 118. For example, the buffer 114 may not be able to generate zero volts at its output 116 in response to receiving zero volts at input 112. For example, in response to an input of zero volts at input 112, the buffer 114 may generate at output 116 a voltage of 0.7 volts instead of an output voltage of zero volts. Alternatively, buffer 114 may be designed to work at these low input voltages but then may be unable to operate properly with larger input voltages.

Figure 2:
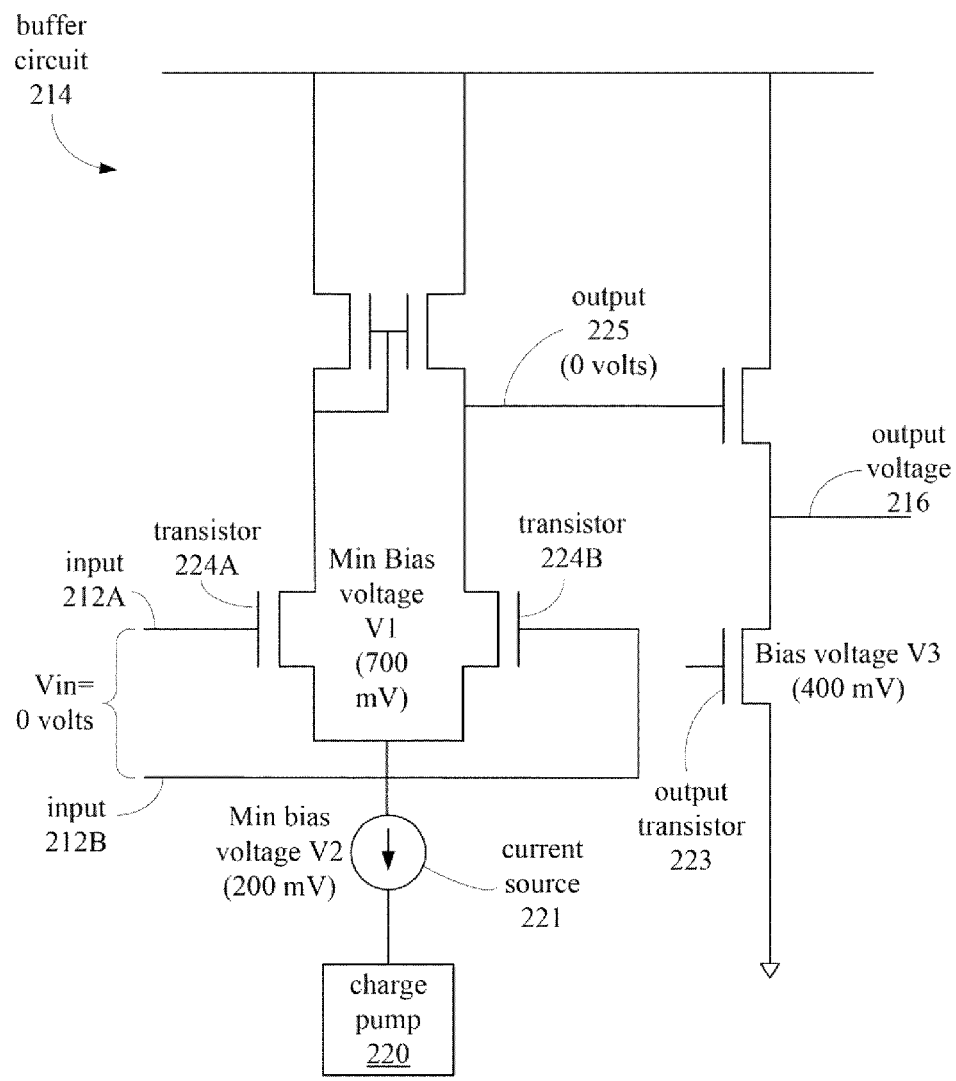
FIG. 2 is a circuit diagram illustrating one embodiment of buffer circuit.

FIG. 2 illustrates a buffer circuit 214 that can be used with the ADC 118. The differential buffer 214 includes inputs 212A and 212B that control transistors 224A and 224B, respectively. Transistors 224A and 224B operate with a minimum bias voltage V1. Current source 221 has a minimum bias voltage V2. These minimum bias voltages V1 and V2 create a voltage offset between the input voltage $V_{IN}$ (across inputs 212A and 212B) and the output voltage 216. Without charge pump 220, buffer circuit 214 would not output small voltages that are below the voltage offset.

Charge pump 220 is coupled to current source 221 to compensate for the offset voltages V1 and V2. The charge pump 220 pulls down the voltage at current source 221 below zero volts so that the buffer circuit 214 can operate at low input voltages even with the minimum bias voltages V1 and V2. Accordingly, voltages as low as zero volts at input 212 will generate corresponding output voltages at output 225.

However, the buffer circuit 214 also includes an output transistor 223 that operates with a minimum bias voltage V3. Accordingly, the buffer circuit 214 in FIG. 2 may not operate properly at voltages below the bias voltage V3 of transistor 223.

One embodiment of a buffer circuit includes a number of programmable circuit modules that enable the buffer circuit to be programmed to generate a desired output. For example, one programmable circuit module may set the overall gain of the buffer circuit, while another programmable circuit module may allow the buffer circuit to operate in either single-ended or differential mode.

In one embodiment, each of the programmable circuit modules can be configured independently from each of the other programmable circuit modules. For example, one configuration of a gain programming module may set the gain for the buffer circuit whether the buffer circuit is operating in a single-ended or differential mode. As another example, an input range selection module may determine an amount of voltage offset of the output signal of the buffer circuit, where the selected voltage offset is not affected by the configuration of the gain programming module, or by whether the buffer circuit is operating in a differential mode or a single-ended mode.

In one embodiment, a programmable circuit module may include a number of switches that can be used to configure the programmable circuit module. For example, the switches may be used to connect or disconnect electrical components within the programmable circuit module in different configurations, so that a selected configuration of the programmable circuit module may be determined by a particular combination of switches.

Figure 3A:
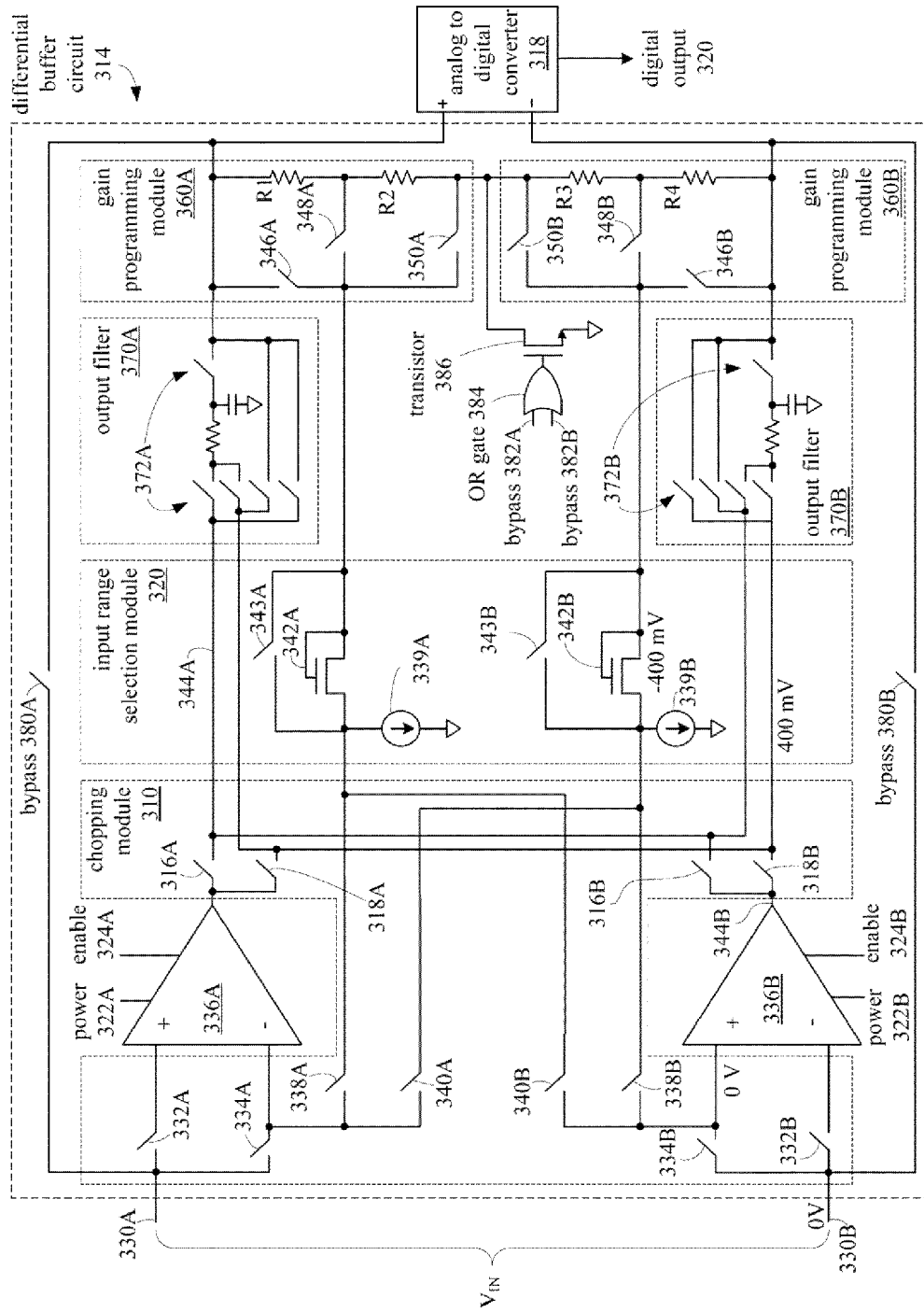
FIG. 3A is a circuit diagram illustrating one embodiment of a buffer circuit having programmable circuit modules.

FIG. 3A illustrates a differential buffer circuit 314 having programmable gain, input range selection, chopping and filtering functions. These functions are implemented by programmable circuit modules, including the gain programming modules 360A and 360B, the input range selection module 320, and the chopping module 310, respectively.

The differential buffer circuit 314 can also be configured to operate in either differential or single-ended mode, and includes two core buffers 336A and 336B. Core buffers 336A and 336B can be enabled or disabled, and have adjustable power settings.

The differential buffer circuit 314 buffers an input signal $V_{IN}$ and outputs the buffered signal to analog to digital converter (ADC) 318. ADC 318 converts the buffered voltage to a digital code at digital output 320. Each of the programmable circuit modules can be programmed, or configured, to affect some characteristic of the output of differential buffer circuit 314. Furthermore, the selected configuration of each programmable circuit module does not affect the configuration of other programmable circuit modules. For example, reconfiguring the input range selection module 320 to operate with a different input range does not affect the gain of the buffer circuit 314, as determined by the gain selection module.

In one embodiment, the differential buffer circuit 314 deals with signals closer to ground in some applications while operating on voltages closer to the supply rail in others. Thus, the differential buffer circuit 314 can be configured to operate in either of two main modes of operation: the level shifted mode or the rail-to-rail mode.

In one embodiment, the difference between the level shifted mode and the rail-to-rail mode is the input voltage range. The input voltage range is the range over which an input signal can be properly buffered. Thus, for a buffer circuit 314 having a programmable input range, the input range can be selected to include the dynamic range of the input signal. In one embodiment, the buffer circuit 314 is operating properly when the output signal is linear relative to the input signal. Thus, the input voltage range is the voltage range of the input signal over which the output is linear. Alternatively, the buffer circuit 314 may generate an output from the input based on some other non-linear function when operating properly, so that the output is related to the input by this function when the input is within the input voltage range. In one embodiment, the function defining the output signal relative to the input signal is defined by selected configurations of one or more programmable circuit modules in the buffer circuit 314.

Figure 3B:
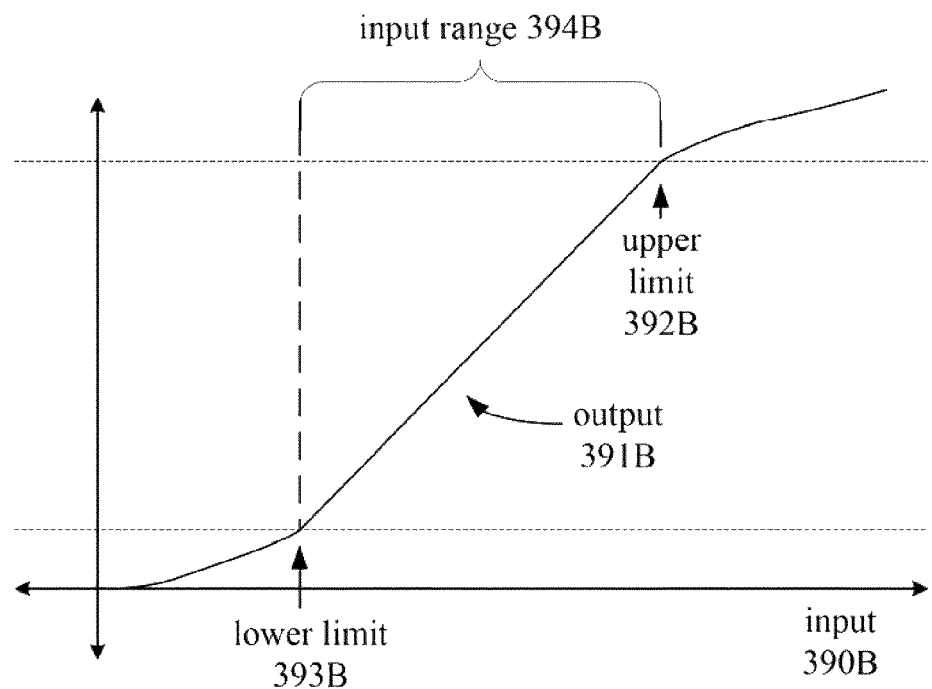
FIG. 3B is a graph illustrating a relationship between an input signal and an output signal of a buffer circuit operating in a rail-to-rail mode, according to one embodiment.

FIG. 3B illustrates a graph of the output of one embodiment of a buffer circuit 314 relative to the input while the buffer circuit 314 is operating in a rail-to-rail mode. The horizontal axis represents the value of the input signal 390B, while the curve output 391B represents the output of a buffer circuit such as buffer circuit 314 for the possible input values of input 390B. The input range 394B is defined by a lower limit 393B and an upper limit 3928. In one embodiment, the output voltage corresponding to the lower limit 393B is approximately 50 mV from the lower supply rail, while the output voltage corresponding to the upper limit 392B is approximately 50 mV from the upper supply rail. The relationship input 390B and output 391B is linear when the input 390B is between the lower limit 393B and the upper limit 392B.

Figure 3C:
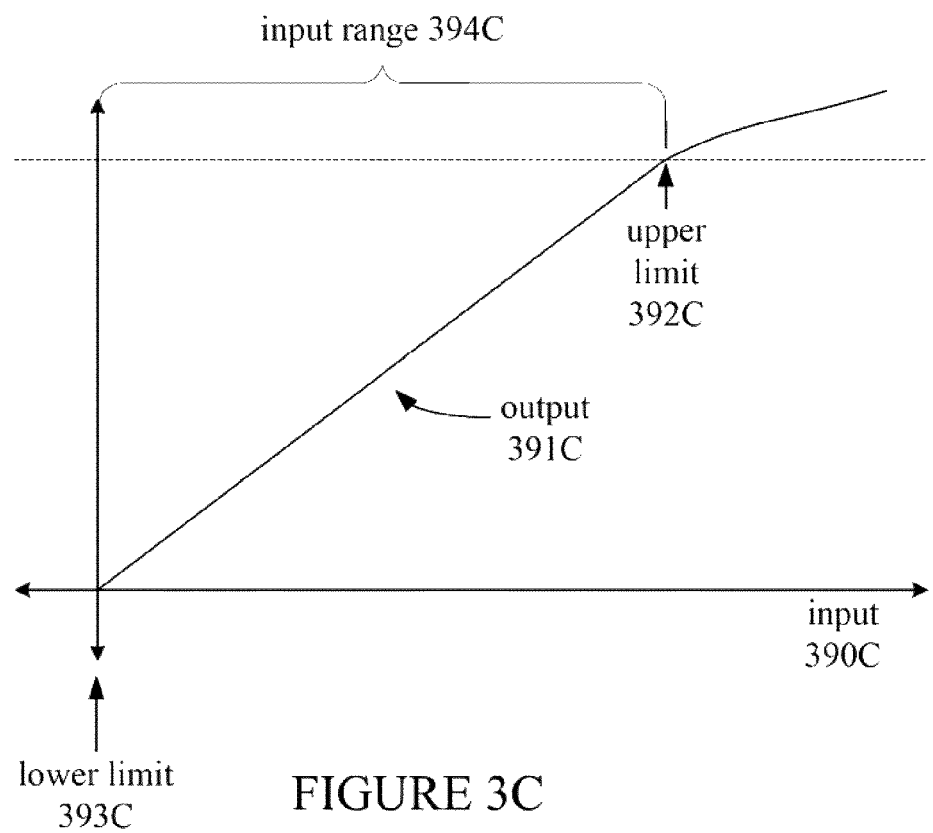
FIG. 3C is a graph illustrating a relationship between an input signal and an output signal of a buffer circuit operating in a level shifted mode, according to one embodiment.

FIG. 3C illustrates a graph of the output of one embodiment of a buffer circuit 314 relative to the input while the buffer circuit 314 is operating in a level shifted mode. In FIG. 3C, the input 390C causes the buffer circuit 314 to generate output 391C. The level shifted input range 394 is defined by lower limit 393C and upper limit 392C. In one embodiment, the lower limit is less than 50 mV from the lower supply rail, while the upper limit 392C is approximately 700 mV from the upper supply rail. The relationship input 390C and output 391C is linear when the input 390C is between the lower limit 393C and the upper limit 392C.

Referring back to FIG. 3A, When the differential buffer circuit 314 is operating in the level shifted mode, the input voltage range of buffer circuit 314 can be level shifted down to accommodate an expected input close to 0V. In one embodiment, the input range is determined by a level shifting circuit. With reference to FIG. 3, the level shifting circuit may include transistors 342A and 342B and associated current sources 339A and 339B. In one embodiment, the level shifting circuit shifts the input voltage range so that the input voltage range includes a ground voltage, or zero volts. For example, the level shifting circuit may shift an input voltage range of 0.05V-11.95V down to 0.00V-11.90V. The level shifting circuit may be used shift input voltage ranges whether the input voltage ranges are negative or positive. Furthermore, the level shifting circuit may be capable of shifting the input voltage range in either direction. In one embodiment, the input voltage range may be shifted so that one of its limits is within ±50 mV of the ground voltage. Alternatively, the input voltage range may be shifted to include voltages within ±5 mV, ±10 mV, ±15 mV, ±20 mV, ±25 mV, ±30 mV, ±35 mV, ±40 mV, or ±45 mV of the ground voltage.

In one embodiment, rail-to-rail mode may be used when the dynamic range of the input signal is rail-to-rail. In one embodiment, differential buffer circuit 314 compensates for an offset voltage resulting from the minimum bias voltages of transistors in buffers 336A and 336B by level-shifting the outputs of buffers 336A and 336B.

In one embodiment, the differential buffer circuit 314 includes input range selection module 320, which includes switches 343A and 343B, transistors 342A and 342B, and current sources 339A and 339B. The input voltage range corresponds to the selected configuration of the input range selection module 320, where the selected configuration is determined by which of switches 343A and 343B are opened or closed. Transistors 342A and 342B and associated current sources 339A and 339B are components in a level shifting circuit and are used to level shift the output voltage 344A and 344B of buffer circuits 36A and 36B, respectively. For example, when the input 330B is at zero volts, the 400 mV generated at output 344B is reduced by −400 mV by level shifter circuit comprising transistor 342B and current source 339B, generating zero volts at the inverting input of buffer circuit 336B.

Level shifting is programmable using switches 343A and 343B allowing the buffer 314 to be operated in either the rail-to-rail or the level shifted mode. Switches 343A and 343B can be closed to operate the differential buffer circuit 314 in a rail-to-rail mode, or opened to operate the buffer circuit 314 in a level-shifted mode. For example, if the buffer circuit 314 is used with higher voltages, the switches 343A and 343B can be closed (rail-to-rail mode) so that the transistor 322 in FIG. 2 can maintain an operating bias voltage at high input voltages.

One embodiment of a differential buffer circuit 314 may include gain programming modules 360A and 360B so that the differential buffer circuit 314 can be programmed to provide different selectable voltage gains.

Gain programming modules 360A includes resistors R1 and R2, which can be selectively connected to buffer 336A using switches 348A and 350A. Gain programming module 360B includes resistors R3 and R4, which can be selectively connected to buffer 336B using switches 348B and 350B. Switches 346A and 346B of the gain programming modules 360A and 360B can be used to select unity gain for buffers 336A or 336B, respectively.

In one embodiment, any combination of switches 346A, 348A and 350A can be programmably opened or closed during chip fabrication or dynamically during chip operation. The switches 346A, 348A and 350A programmably connect different combinations of resistors R1 and R2 to the input 330A of buffer circuit 336A. Similarly, combinations of switches 346B, 348B and 350B can be programmably closed or opened to connect different combination of resistors R3 and R4 to the input 330B of buffer circuit 36B.

Gain programming modules 360A and 360B thus allows for the selection of different feedback impedances to adjust the gain of buffers 336A and 336B. In alternative embodiments, different arrangements and values of impedances and switches can be used to provide a programmable feedback impedance. In other embodiments, a gain programming module can be any circuit that can be configured to select from a range or set of available feedback impedances.

The programmable gain setting allows for small input signals to be amplified and could be applied to both differential and single-ended signals.

In one embodiment, a differential buffer circuit may generate an output having an offset voltage relative to the input, where the offset voltage may be systematic or random. For certain applications, the random component of can be removed from the buffer circuitry using a programmable chopping scheme. This chopping can be done at various frequencies, at various gain settings and at single-ended or differential modes of operation.

One type of chopping amplifier breaks up a DC input signal by switching the signal according to a switching frequency so that the signal can be amplified as if it were an AC signal. The output signal is then integrated back into a DC signal at the output.

In one embodiment, a chopping module 310 can be used to perform the chopping function. For example, in differential buffer circuit 314, chopping module 310 includes switches 332A, 332B, 334A, 334B, 338A, 338B, 340A, and 340B, which can be switched according to a switching frequency to modulate the input signal $V_{IN}$.

At the output of buffer 336A, switches 316A and 318A can be used for chopping the output signal. Similarly, switches 316B and 318B can be used to chop the output signal of buffer 336B.

In one embodiment, the chopping module 310 is a programmable chopping module that can be programmed to chop over sections of the architecture of the differential buffer circuit 314. For example, the chopping module 310 can chop the feedback branches connected to buffers 336A and 336B, where the feedback branches are represented by gain programming modules 360A and 360B. The switches of chopping module 310 can be opened and closed so that one gain programming module (i.e., gain programming module 360A) is connected to buffer 336A during part of a switching cycle and is connected to buffer 336B during a different part of the switching cycle.

In one embodiment, chopping of the differential buffer circuit 314 can be performed by changing configurations of one or more programmable circuit modules. For example, the gain programming modules 360A or 360B may be periodically reconfigured to change the gain of differential buffer circuit 314 according to a switching frequency.

In one embodiment, the differential buffer circuit 314 is programmable to operate in either a single-ended mode or a differential mode of operation. Whether the buffer circuit 314 operates in the single-ended or differential mode may be determined by switches, such as switches 332A, 332B, 334A, 334B, 338A, 338B, 340A, and 340B.

In single-ended mode, switches 332A, 332B, 334A, 334B, 338A, 338B, 340A, and 340B are used for connecting the inputs 330A and 330B to a single buffer, or for switching the inputs and outputs for the buffer circuits 336A and 336B. For example, when switches 332A, 338A, 340B, and 334B are closed and switches 334A, 340A, 338B, and 332B are open, both of inputs 330A and 33B are connected to buffer 336A. When switches 334A, 340A, 338B, and 332B are closed and switches 332A, 338A, 340B, and 334B are open, both of inputs 330A and 330B are connected to buffer 336B.

In one embodiment, bypass switches 380A or 380B can be used when configuring differential buffer circuit 314 for operation in a single-ended mode. For example, the differential buffer circuit 314 may be configured to use buffer 336A in a single ended mode while closing bypass switch 380B to bypass buffer 336B. In this configuration, the input 330B is connected directly to the negative input of ADC 318. In one embodiment, a zero volt input can be applied to the negative input of the ADC 318 through the input 330B. A transistor 386 and a logical OR gate 384 can be used in conjunction with bypass switches 380A and 380B to operate the differential buffer circuit 314 in single-ended mode. The OR gate 384 receives as inputs bypass signals 382A and 382B. If either of the bypass signals 382A and 382B are logically high, the OR gate 384, which has its output connected to the gate of transistor 386, allows current to flow through transistor 386. When either of bypass switches 380A or 380B is closed, the corresponding bypass signal 382A or 382B is asserted. Thus, when either of the buffers 336A or 336B is bypassed, the feedback branches represented by gain programming modules 360A and 360B are connected to ground through transistor 386. In one embodiment, in the single-ended configuration, the feedback branches are connected to ground while one of the inputs 330A or 330B is also grounded.

When switches 332A, 338B, 338B, and 332B are closed and switches 334A, 340A, 334B, and 340B are open, the inputs 330A and 330B are connected to buffers 336A and 336B, respectively. If the bypass switches 380A and 380B are open, the differential buffer circuit operates in differential mode, with 330A and 330B functioning as the differential inputs.

In one embodiment, the bypass switches 380A and 380B can both be closed to bypass the differential buffer circuit 314 entirely. In this configuration, the inputs 330A and 330B are connected directly to the inputs of the ADC 318. In any of the configurations where buffers 336A or 336B are being bypassed or otherwise not being used, enable pins 324A and 324B can be used to enable or disable buffers 336A or 336B.

In one embodiment, the differential buffer circuit 314 has programmable power settings for each of the buffers 336A and 336B. The programmable circuit modules of differential buffer circuit 314 may include a power programming module (not pictured) that is configured to adjust the power settings of buffers 336A and 336B through power pins 322A and 322B, respectively.

In one embodiment of a differential buffer circuit 314, additional filtering may also be performed to decrease the noise contribution from the buffer. Filtering may also decrease the effects of ripple voltage due to the chopping performed by chopping module 310. With reference to FIG. 3, output filters 370A and 370B are programmable circuit modules used to implement filtering of the buffer circuit output signal before the output signal is converted to a digital code by ADC 318. Filters 370A and 370B are programmable output filters that each have a set of switches 372A and 372B, respectively, which can be used to either bypass a network of resistors and capacitors (RC network) used for filtering, or to connect the RC network in different configurations. Different combinations of switches in the programmable output filters 370A and 370B may select components of different values to be connected in the RC network so that filtering of different frequency bands can be selected. In an alternative embodiment, the filters 370A and 370B may include an active filter rather than a passive filter.

Thus, the differential buffer circuit 314 in FIG. 3A can be programmed to operate either at low voltages or high voltages, to provide different gain values, and to connect different inputs and outputs. This can be accomplished using a number of independently programmable circuit modules, which allow the differential buffer circuit 314 to be programmed to accept certain types of input signals and to generate an output with desired characteristics.

Figure 4:
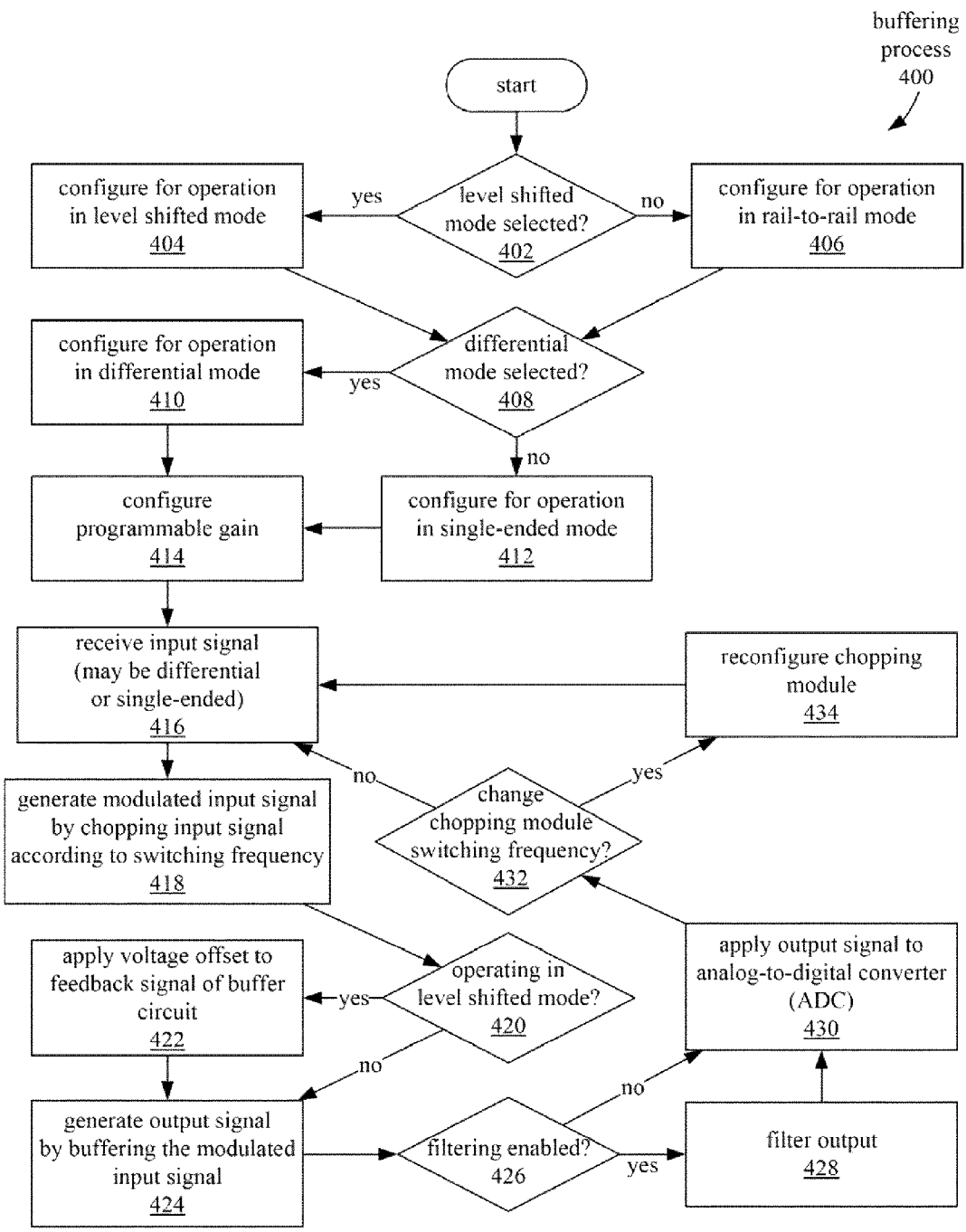
FIG. 4 is a block diagram illustrating a process for buffering an input signal, according to one embodiment.

FIG. 4 illustrates a process for buffering an input signal, according to one embodiment. Buffering process 400 may be implemented by a buffering circuit such as differential buffer circuit 314. According to process 400, configurations of programmable circuit modules of differential buffer circuit 314 may be selected dynamically as a result of user input or may be changed according, to input from a computer or other electronic system. In an alternative embodiment, the configurations of the programmable circuit modules may be determined before beginning operation of the circuit, such as at design-time or at initialization of the buffer circuit 314.

Buffering process 400 begins at block 402. At block 402, if the buffer circuit 314 is selected to be operated in a level shifted mode, the process continues at block 404. At block 404, the process 400 configures the differential buffer circuit 314 for operation in a level shifted mode. For example, the buffer circuit 314 may be configured for operating in a level shifted mode by opening switches 343A and 343B, which allows transistors 342A and 342B and current sources 339A and 339B to add a voltage offset to the feedback branches of their respective buffers 336A and 336B. From block 404, the process 400 continues at block 408.

If at block 402, a level shifted mode is not selected, the process 400 continues at block 406. At block 406, the process 400 configures the differential buffer circuit 314 for operation in a rail-to-rail mode. For example, the buffer circuit 314 may be configured to operate in a rail-to-rail mode by closing switches 343A and 343B. This effectively removes the voltage offset generated by transistors 342A and 342B and current sources 339A and 339B from the feedback branches of buffers 336A and 336B. From block 406, the process 400 continues at block 408.

At block 408, if the buffer circuit is selected to be operated in a differential mode, the process 400 continues at block 410. At block 410, the process 400 configures the differential buffer circuit 314 for operation in a differential mode. For example, the differential buffer circuit 314 can be configured to operate in a differential mode by closing switches 332A, 338A, 338B, and 332B and opening switches 334A, 340A, 334B, and 340B. From block 410, the process 400 continues at block 414.

If, at block 408 the differential mode is not selected, the process 400 continues at block 412. At block 412, the process 400 configures the differential buffer circuit 314 for operation in a single-ended mode. For example, the differential buffer circuit 314 can be configured for operation in a single-ended more by closing switches 332A, 338A, 340B, and 334B, while opening switches 334A, 340A, 338B, and 332B. In this configuration, both of the inputs 330A and 33B are connected to buffer 336A. Alternatively, single-ended mode operation can also be selected by closing switches 334A, 340A, 338B, and 332B while opening switches 332A, 338A, 340B, and 334B. In one embodiment, the buffer circuit 314 may include bypass switches 380A and 380B, which can be used when operating the buffer circuit 314 in single-ended mode. For example, when the differential buffer circuit 314 is configured to use buffer 336A in a single ended mode, bypass switch 380B may be closed to bypass buffer 336B. In this configuration, the input 330B is connected directly to the negative input of ADC 318. A transistor 386 and a logical OR gate 384 can be used in conjunction with bypass switches 380A and 380B to operate the differential buffer circuit 314 in single-ended mode. Bypass signals 382A and 382B are received by the OR gate 382. If either of the bypass signals 382A and 382B are logically high, the OR gate 384, which has its output connected to the gate of transistor 386, allows current to flow through transistor 386. When either of bypass switches 380A or 380B is closed, the corresponding bypass signal 382A or 382B is asserted. Thus, when either of the buffers 336A or 336B is bypassed, the feedback branches represented by gain programming modules 360A and 360B are connected to ground through transistor 386. In one embodiment, in the single-ended configuration, the feedback branches are connected to ground while one of the inputs 330A or 330B is also grounded. From block 412, the process 400 continues at block 414.

At block 414, the process 400 configures the programmable gain of differential buffer circuit 314. In one embodiment where the gain is programmable using a network of switched impedances, the gain may be programmed by selectively connecting impedances to adjust the total impedance of a feedback branch of buffers in the buffer circuit 314. For example, with reference to FIG. 3, the switches 348A, 350A, 348B, and 350B can be opened or closed to select a combination of resistors R1, R2, R3, and R4 to connect to the feedback branches of buffers 336A and 336B. Switches 346A and 346B can be closed to select unity gain. From block 414, the process 400 continues at block 416.

At block 416, the process 400 receives an input signal at an input of the differential buffer circuit 314. The input signal may be a single-ended or a differential signal, depending on whether the buffer circuit 314 is operating in a differential mode or a single-ended mode. For example, with reference to FIG. 3, the input signal may be received at inputs 330A and 330B. If the buffer circuit 314 is operating in differential mode, the inputs 330A and 330B may serve as a pair of differential inputs. When the buffer circuit 314 is operating in single-ended mode, one of the inputs 330A or 330B may be grounded while the input signal is received at the other. From block 416, the process 400 continues at block 418.

At block 418, the process 400 generates a modulated input signal by chopping the input signal received at block 416. For example, the chopping may be performed by chopping module 310, which includes switches 332A, 334A, 338A, 340A, 332B, 334B, 338B, and 340B. These switches are operated according to a switching frequency to chop the input signal received at inputs 330A and 330B. From block 418, the process 400 continues at block 420.

If, at block 420, the differential buffer circuit 420 is not operating in a level shifted mode, the process 400 continues at block 424. At block 420, if the differential buffer circuit 420 is operating in a level shifted mode, the process 400 continues at block 422.

At block 422, the process 400 applies a voltage offset to a feedback signal of the differential buffer circuit 314. For example, in differential buffer circuit 314, the voltage offset may be applied by transistor 342A in conjunction with current source 339A to the feedback branch of buffer 336A. Similarly, a voltage offset may be applied by transistor 342B and current source 339B to the feedback branch of transistor 336B. From block 422, the process continues at block 424.

At block 424, the process 400 generates an output signal by buffering the modulated input signal. In one embodiment, switches may be used to perform chopping on the output signal. For example, buffer 336A receives an input signal from input 330A (which is chopped using switches 332A, 334A, 338A, and 340A) and generates an output signal that is chopped using switches 316A and 318A. From block 424, the process continues at block 426.

At block 426, the process 400 continues at block 430 if filtering has not been enabled, or continues at block 428 if filtering has been enabled. In differential buffer circuit 314, filtering may be enabled using switches 372A or 372B. These switches 372A and 372B can be opened or closed to either bypass the output filters 370A and 370B, or to connect the output filters 370A and 370B according to a selected configuration within the buffer circuit 314. If the output filters 370A and 370B have not been bypassed using switches 372A and 372B, filtering is enabled, and the process 400 continues at block 428.

At block 428, the process 400 filters the output signal generated at block 424. For example, differential buffer circuit 314 filters its output signal using output filters 370A and 370B, which may remove noise from the buffers 336A and 336B, or may remove ripple voltage from chopping. From block 428, the process 400 continues at block 430.

At block 430, the filtered signal is applied to ADC 318, which converts the signal into a digital code at digital output 320. From block 430, the process 400 continues at block 432.

At block 432, if the chopping frequency is changed, the process continues at block 434. For example, the chopping frequency may be changed dynamically during the operation of the buffer circuit 314, in response to a user input or a signal from a computer or other electronic system. If the chopping frequency is changed, the process 400 continues at block 434.

At block 434, the process 400 changes the chopping frequency by reconfiguring the chopping module 310. For example, in differential buffer circuit 314, the reconfiguration may cause the switches in chopping module 310 may be operated at a different switching frequency. From block 434, the process 400 continues at block 416, where the buffer circuit 314 receives the input signal.

In one embodiment, another programmable circuit module can be reconfigured dynamically at blocks 432 and 434, instead or in addition to the chopping module. For example, the gain programming modules 360A and 360B can be reconfigured to adjust the gain of the buffer circuit 314 in similar operations as those represented by blocks 432 and 434.

The differential buffer circuit 314 is thus capable of buffering an input signal to be converted to a digital code by an ADC. The buffering of the input signal according to process 400, can be chopped to correct for voltage offsets and drift, amplified according to a selected gain factor, and level shifted depending on a configuration of the differential buffer circuit 314. Furthermore, programmable circuit modules can be configured so that the buffer circuit accepts a desired range or type of input signal and generates an output signal having particular characteristics.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette, hard drive); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, or digital signals), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A buffer circuit, comprising:
    an input configured to receive an input signal;
    a buffer configured to generate an output signal based on the input signal, wherein the output signal has a linear relationship with the input signal when the input signal is within the input voltage range; and
    a level-shifting circuit coupled with the input, wherein the level shifting circuit determines an input voltage range, and wherein one of an upper limit and a lower limit of the input voltage range is within 50 millivolts from a supply rail voltage.

2. The buffer circuit of claim 1, wherein the level-shifting circuit is configured to apply a voltage offset to a feedback signal of the buffer.

3. The buffer circuit of claim 1, further comprising a programmable circuit module coupled with the buffer, wherein the buffer is further configured to generate the output based on a selected configuration of the programmable circuit module.

4. The buffer circuit of claim 3, wherein the programmable circuit module includes a plurality of switches, and wherein the plurality of switches determines the selected configuration of the programmable circuit module.

5. The buffer circuit of claim 3, wherein the input voltage range corresponds to the selected configuration of the input range selection module.

6. The buffer circuit of claim 3, wherein the programmable circuit module includes a programmable chopping module coupled with the buffer, and wherein the programmable chopping module is configured to modulate the input signal.

7. The buffer circuit of claim 6, wherein the buffer is further configured to generate the output signal based on the modulated input signal.

8. The buffer circuit of claim 6, wherein the chopping module modulates the input signal according to a switching frequency corresponding to the selected configuration of the programmable chopping module.

9. The buffer circuit of claim 3, wherein the programmable circuit module includes a programmable output filter coupled with the buffer, wherein the programmable output filter is configured to filter the output signal.

10. The buffer circuit of claim 3, wherein the programmable circuit module includes a gain programming module coupled with the buffer, wherein a configuration of the gain programming module determines a gain of the output signal relative to the input signal.

11. The buffer circuit of claim 10, wherein the gain programming module comprises:
    a plurality of impedances; and
    a plurality of switches, wherein each of the plurality of switches is configured to selectively couple one of the plurality of impedances with the buffer.

12. The buffer circuit of claim 3, wherein the programmable circuit module includes a differential mode selection module, and wherein the buffer circuit operates in one of a differential mode and a single-ended mode based on a configuration of the differential mode selection module.

13. A buffer circuit, comprising:
    an input configured to receive an input signal;
    a buffer configured to generate an output signal based on the input signal;
    a programmable output filter coupled with the buffer, wherein the programmable output filter is programmable with a selected configuration from a plurality of configurations, and wherein the programmable output filter filters a frequency band of the output signal based on the selected configuration; and
    a level-shifting circuit coupled with the input, wherein the level shifting circuit determines an input voltage range.

14. The buffer circuit of claim 13, wherein the input voltage range includes voltages within 50 millivolts from a ground voltage; and wherein the output signal has a linear relationship with the input signal when the input signal is within the input voltage range.

15. The buffer circuit of claim 13, further comprising a programmable circuit module coupled with the buffer, wherein the buffer is further configured to generate the output based on a selected configuration of the programmable circuit module.

16. The buffer circuit of claim 15, wherein the programmable circuit module includes a plurality of switches, and wherein the plurality of switches determines the selected configuration of the programmable circuit module.

17. The buffer circuit of claim 15, wherein the programmable circuit module includes a programmable chopping module coupled with the buffer, and wherein the chopping module is configured to generate a modulated input signal by chopping the input signal.

18. The buffer circuit of claim 17, wherein the buffer is further configured to generate the output signal based on the modulated input signal.

19. The buffer circuit of claim 17, wherein the chopping module is programmable for operation according to a selected switching frequency.

* * * * *